United States Patent [19]

Wells, II

[11] Patent Number: 4,768,065
[45] Date of Patent: Aug. 30, 1988

[54] TABLE STABILIZATION ASSEMBLY

[75] Inventor: Russell N. Wells, II, Santa Clara, Calif.

[73] Assignee: General Signal Corp., Stamford, Conn.

[21] Appl. No.: 914,036

[22] Filed: Oct. 1, 1986

[51] Int. Cl.$^4$ .............................................. G03B 27/52
[52] U.S. Cl. ...................................................... 355/43
[58] Field of Search .................. 355/133, 43; 354/292; 248/638

[56] References Cited

U.S. PATENT DOCUMENTS 4,425,037  1/1984  Hershel et al. .......................... 355/43
4,431,494  2/1984  McIntyre et al. ...................... 204/83

Primary Examiner—L. T. Hix
Assistant Examiner—Brian W. Brown
Attorney, Agent, or Firm—Flehr, Hohbach, Test, Albritton & Herbert

[57] ABSTRACT

A table stabilization assembly is disclosed. The assembly is intended for use in a microlithography system which includes a stable for supporting a movable stage and a frame support for supporting the table. The assembly includes a pair of brake leaves which are respectively attached to the table and frame support and which are clamped together during stage acceleration or deceleration to provide stabilization.

4 Claims, 2 Drawing Sheets

TABLE STABILIZATION ASSEMBLY

BACKGROUND OF THE INVENTION

The present invention relates to apparatus for use in a microlithography system, and more particularly to a table stabilization assembly for use therein.

Microlithography systems are well known in the art. Such systems are utilized for microlithographically forming patterns on semiconductor wafers. Such systems require precise and accurate positioning of a movable stage, with required accuracy typically in the micron range. Typical systems are desribed, for example, in U.S. Pat. Nos. 4,425,037, and 4,431,494, which are commonly assigned to the same assignee as the present invention.

In such microlithography systems, the movable stage is supported by a table and in turn the table can be stably supported by a suitable support means such as a frame.

A problem which occurs in prior art systems is when a stage is moved, either by acceleration or deceleration. Such movement can cause undesired vibrations in the system, which consequently can seriously affect the accuracy of the entire system.

SUMMARY OF THE INVENTION

In view of the foregoing, it is an object of the present invention to provide a table stabilization assembly or apparatus for use in a microlithography system.

Briefly, the present invention includes a table for supporting a movable stage for use in the microlithography system. The apparatus further includes frame support means for supporting the table. The apparatus also includes brake leaf means attached between the table and the support means and means for engaging (or clamping) the brake leaf means together when the stage is accelerating or decelerating. This provides for improved throughput and affords better vibration isolation.

Other objects, features and advantage of the present invention will become apparent from the following detailed description when taken in conjunction with the accompanying drawings.

DETAILED DESCRIPTION OF THE DRAWINGS

Figure 1:
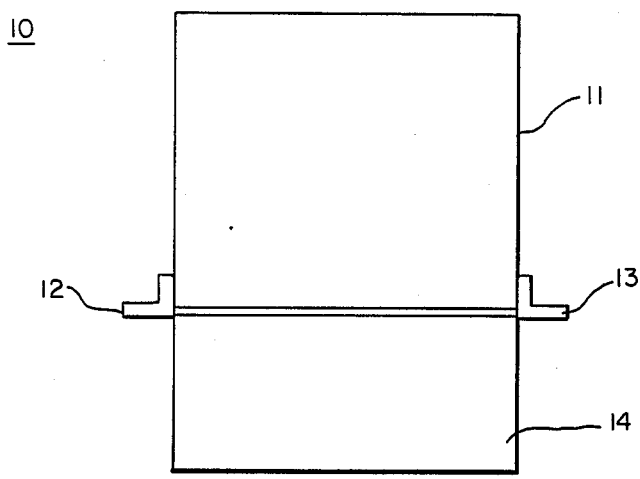
FIG. 1 depicts a block diagram of a microlithography system which incorporates a table stabilization assembly according to the present invention.

Referring now to FIG. 1, a very general block diagram of a microlithography system 10 is depicted. The system 10 includes a table 11 which supports a movable stage (not shown) for use in microlithography systems. The table 11 is typically made of a granite rock. The system 10 further includes a frame support means 14 for supporting the table 11.

The system 10 also includes a brake leaf means 12, 13 which are attached between the table 11 and frame support 14 for providing improved stabilization when a stage is moved. Further details of the actual operation of a photolithography system are described in U.S. Pat. Nos. 4,391,494 and 4,425,037. The actual operation details of a movable stage need not therefore be described in any further detail.

However, in operation of microlithography systems, it has been observed that the movement of a stage can have an adverse vibrational effect on the system. The frame support means 14, table 11 and brake leaf means 12, 13 of FIG. 1 provide vibration isolation. With the acceleration or deceleration of a moving stage, the stabilization of the microlithography system can be affected.

The present invention provides an apparatus for improved table stabilization of a microlithography system, as will now be described in conjunction with FIGS. 2-4.

Figure 2:
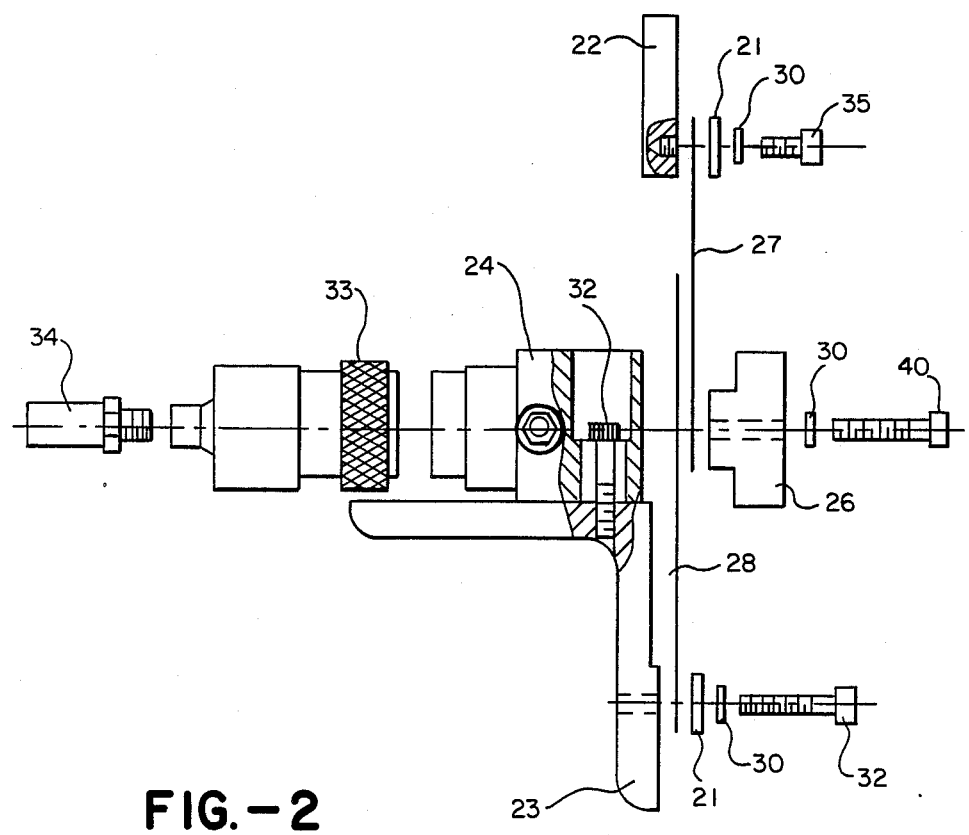
FIGS. 2 and 3 depict cross-sectional views of a table stabilization assembly according to the present invention.
Figure 3:
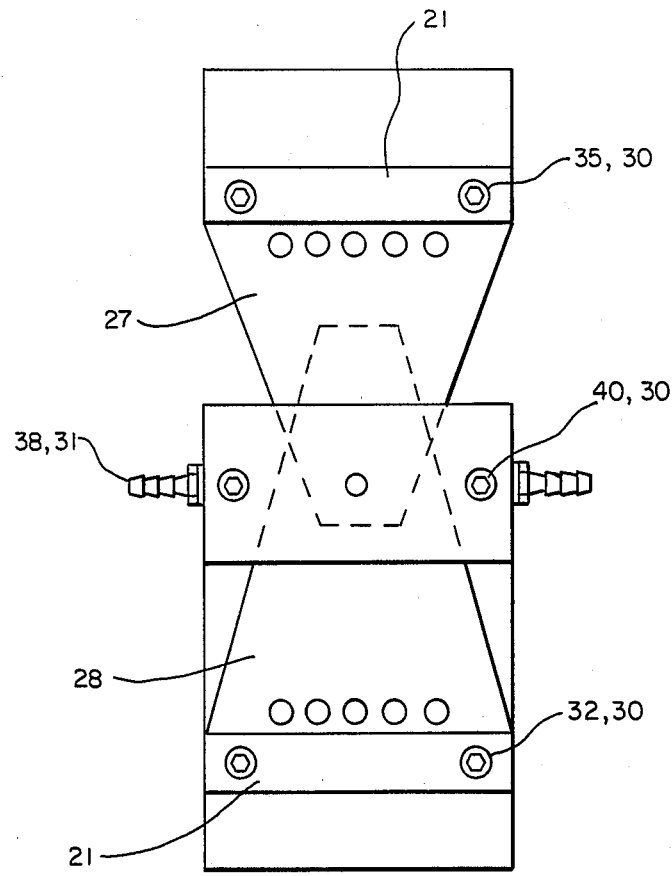

Referring now to FIGS. 2 and 3, cross-sectional views of a brake leaf assembly of FIG. 1 are depicted in more detail.

The brake leaf assembly includes a base angle support 23 which provides support for a first brake leaf 28, which is fixedly attached to base angle support 23 via a suitable fastening means, such as a screw 32.

The brake leaf assembly further includes an anchor 22 for supporting or engaging a second brake leaf 27, which is attached to anchor 22 via a suitable fastening means, such as screw 35. The brake leaf assembly can be made of a suitable material such as stainless steel.

The arrangement of a table stabilization assembly as shown in FIG. 3 includes a spacer frame 21 in cooperation with upper brake leaf 27. The brake assembly in FIG. 3 also includes a gasket 38 and adapter 31.

The lower brake leaf 28 is engagable with upper brake leaf 28 when a suitable engaging or clamping force is applied to brake leaves 27, 28.

The view depicted in FIG. 2 includes a muffler 34, which can be connected to a suitable valve 33. The brake assembly in FIG. 2 also includes a front brake pad 26.

Figure 4:
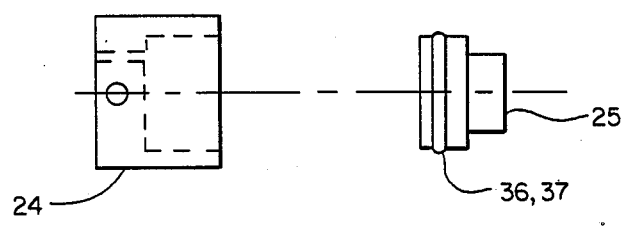
FIG. 4 depicts a more detailed view of a piston and brake cylinder, which form a part of FIG. 2.

Detail A of FIG. 2 is depicted in more detail in FIG. 4, which includes a brake cylinder 24, piston 25 together with suitable O ring 36 and grease 37.

As would be apparent to one ordinary skill in the art, by suitable application of a clamping force to brake leaves 27, 28, during a stepping operation, the frame support 14 can be rigidly clamped to table 11, which significantly reduces step and settle time in a microlithography system. Leaves 27, 28 of FIGS. 2 and 3 are engaged or clamped together when motor current indicates stage acceleration or deceleration. The leaves 27, 28 can be disengaged by the cessation of stage movement. The motor current indication need not be shown, as that is a technique known in the art.

By clamping the brake leaves 27, 28 after stage acceleration or deceleration is detected allows the table 11 to stabilize sooner.

What is claimed is:

1. Apparatus for use in a microlithography system, said apparatus comprising
    a table for supporting a movable stage,
    frame support means for supporting said table,
    brake leaf means having engageable brake leaf members attached between said table and said support means, respectively,
    means for clamping said brake leaf members together when said stage is moved in order to stabilize said table.

2. The apparatus of claim 1 wherein said means for clamping is disengaged when movement of said stages ceases whereby said brake leaf members are not clamped.

3. Apparatus for use in a microlithography system, said apparatus comprising
a table for supporting a movable stage,
frame support means for supporting said table,
clamping means attached between said table and said support means, said clamping means including
brake leaf means haivng engageable brake leaf members for engaging said support means and said table together when said stage is moved to stabilize said table.

4. In a microlithography system having a table for supporting a movable stage and a frame support for supporting said table, the apparatus comprising
brake leaf means having engageable brake leaf members attached between said table and said support means, respectively, and
means for clamping said brake leaf means together when said stage is moved in order to stabilize said table.

* * * * *